US009922970B2

(12) United States Patent
Ramachandran et al.

(10) Patent No.: US 9,922,970 B2
(45) Date of Patent: Mar. 20, 2018

(54) INTERPOSER HAVING STACKED DEVICES

(71) Applicant: QUALCOMM Incorporated, San Diego, CA (US)

(72) Inventors: Vidhya Ramachandran, Cupertino, CA (US); Miguel Angel Miranda Corbalan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 53 days.

(21) Appl. No.: 14/622,273

(22) Filed: Feb. 13, 2015

(65) Prior Publication Data
US 2016/0240527 A1 Aug. 18, 2016

(51) Int. Cl.
| H01L 27/06 | (2006.01) |
| H01L 23/14 | (2006.01) |
| H01L 23/15 | (2006.01) |
| H01L 23/498 | (2006.01) |
| H01L 23/538 | (2006.01) |
| H01L 25/065 | (2006.01) |
| H01L 23/48 | (2006.01) |
| H01L 27/02 | (2006.01) |
| H01L 49/02 | (2006.01) |
| H01L 29/66 | (2006.01) |
| H01L 29/861 | (2006.01) |

(52) U.S. Cl.
CPC ........ *H01L 27/0688* (2013.01); *H01L 23/147* (2013.01); *H01L 23/15* (2013.01); *H01L 23/481* (2013.01); *H01L 23/49822* (2013.01); *H01L 23/49844* (2013.01); *H01L 23/5383* (2013.01); *H01L 23/5389* (2013.01); *H01L 25/0657* (2013.01); *H01L 27/0255* (2013.01); *H01L 27/0676* (2013.01); *H01L 28/40* (2013.01); *H01L 29/6609* (2013.01); *H01L 29/861* (2013.01)

(58) Field of Classification Search
CPC ............... H01L 27/0688; H01L 23/481; H01L 23/49844; H01L 27/0255; H01L 27/0676; H01L 28/40; H01L 29/6609; H01L 29/861

See application file for complete search history.

(56) References Cited

U.S. PATENT DOCUMENTS

| 4,716,568 A | 12/1987 | Scifres et al. |
| 5,644,167 A | 7/1997 | Weiler et al. |
| 6,784,517 B2 | 8/2004 | Kleveland et al. |
| 6,835,974 B2 | 12/2004 | Shau |

(Continued)

FOREIGN PATENT DOCUMENTS

| EP | 1755164 A2 | 2/2007 |
| EP | 2790027 A1 | 10/2014 |

(Continued)

OTHER PUBLICATIONS

International Search Report and Written Opinion—PCT/US2016/017780—ISA/EPO—dated Jun. 1, 2016, 13 pages.

*Primary Examiner* — Peter Bradford
(74) *Attorney, Agent, or Firm* — Qualomm Incorporated-Toler

(57) ABSTRACT

An apparatus includes a substrate and an interposer associated with the substrate. The apparatus further includes a first device disposed within the substrate or within the interposer and a second device disposed within the interposer. The first device and the second device are arranged in a stacked configuration.

27 Claims, 9 Drawing Sheets

(56) References Cited

U.S. PATENT DOCUMENTS

| | | |
|---|---|---|
| 7,566,960 B1 | 7/2009 | Conn |
| 8,080,862 B2 | 12/2011 | Kaskoun et al. |
| 8,232,625 B2 | 7/2012 | Voldman |
| 8,581,363 B2 | 11/2013 | Yoon |
| 8,693,241 B2 | 4/2014 | Kim et al. |
| 8,913,402 B1 | 12/2014 | Berg et al. |
| 2003/0173669 A1* | 9/2003 | Shau .................. H01L 21/8221 257/758 |
| 2008/0296697 A1* | 12/2008 | Hsu .................. H01L 23/49827 257/379 |
| 2008/0308143 A1 | 12/2008 | Atanackovic |
| 2009/0283898 A1* | 11/2009 | Janzen .............. H01L 21/76898 257/698 |
| 2010/0013073 A1* | 1/2010 | Andry ................ H01L 21/6835 257/686 |
| 2010/0194470 A1 | 8/2010 | Monchiero et al. |
| 2011/0072409 A1* | 3/2011 | Gambino .......... H01L 27/14632 716/136 |
| 2012/0002392 A1 | 1/2012 | Karp et al. |
| 2012/0175731 A1 | 7/2012 | Chen et al. |
| 2012/0182650 A1 | 7/2012 | Chi |
| 2013/0082765 A1 | 4/2013 | Kaneko et al. |
| 2014/0008770 A1 | 1/2014 | Guenther et al. |
| 2014/0071566 A1 | 3/2014 | Parthasarathy et al. |
| 2014/0327105 A1 | 11/2014 | Ramachandran et al. |
| 2015/0206864 A1* | 7/2015 | Harazono ......... H01L 23/49844 257/329 |
| 2016/0019332 A1* | 1/2016 | Goel .................. G01R 31/2851 716/103 |
| 2016/0126291 A1* | 5/2016 | Lu ...................... H01L 27/2463 257/5 |

FOREIGN PATENT DOCUMENTS

| | | |
|---|---|---|
| JP | 2013206986 A | 10/2013 |
| WO | 03079452 A1 | 9/2003 |
| WO | 2014189983 A1 | 11/2014 |
| WO | 2015130680 A1 | 9/2015 |

* cited by examiner

INTERPOSER HAVING STACKED DEVICES

I. FIELD

The present disclosure is generally related to electronic devices and more particularly to electronic devices that include devices having a stacked configuration.

II. DESCRIPTION OF RELATED ART

Performance of an electronic device (e.g., an integrated circuit) may be affected due to noise, stray electric fields, and other effects. The electronic device may include circuitry that mitigates the effects of noise and other signals. For example, an electronic device may include a decoupling capacitor that filters undesired high frequency noise, such as by shunting certain high frequency signals to a ground node. As another example, an electronic device may include circuitry that protects against electrostatic discharge (ESD), such as by shunting electrical currents that have high magnitudes.

Decoupling capacitors, ESD circuitry, and components that mitigate the effects of noise and other signals may occupy a large circuit area. To illustrate, adding a decoupling capacitor reduces circuit area available for other components of the electronic device, such as core logic components. If the size of the decoupling capacitor is reduced to increase circuit area for core logic and other components, the electronic device may be more susceptible to noise and other effects, which can reduce performance (e.g., by corrupting data) or even cause physical damage to the electronic device.

III. SUMMARY

An electronic device may include a diode and a device (e.g., a capacitor or another diode). The diode and the device are arranged in a stacked configuration. Because the diode and the device are arranged in a stacked configuration, a size of the diode may be increased (e.g., doubled) without reducing circuit area available for other components (as compared to a "side-by-side" arrangement in which diodes are formed adjacently within a substrate). As a result, a diode that occupies the same circuit area may have less resistance (due to having greater size), which may improve electrostatic discharge (ESD) protection. The device may include a decoupling capacitor having a greater capacitance (due to having a large size), which may be advantageous in some applications (e.g., in connection with a decoupling capacitor that filters high frequency noise).

One or both of the diode and the device may be included in a stack region, such as an interposer that connects a first die to a second die. For example, the interposer, the first die, and the second die may be integrated within a system-in-package (SiP) device. The interposer may correspond to an "active lite" interposer that includes one or more passive devices (e.g., one or more diodes and/or one or more capacitors). The one or more passive devices may be formed using a thin film deposition process, as an illustrative example. By "offloading" one or more devices (e.g., an ESD diode and/or a decoupling capacitor) from a substrate region to the interposer (e.g., instead of including such components within the first die), circuit area utilization of the first die is more efficient as compared to a "side-by-side" configuration of devices.

In a particular example, an apparatus includes a substrate and an interposer associated with the substrate. The apparatus further includes a first device disposed within the substrate or within the interposer and a second device disposed within the interposer. The first device and the second device are arranged in a stacked configuration.

In another particular example, a method of fabrication of an electronic device includes forming a first device. The first device is disposed within a substrate of the electronic device or within an interposer of the electronic device. The method further includes forming a second device within the interposer. The first device and the second device have a stacked configuration.

In another particular example, an apparatus includes first means for performing circuit operations. The first means for performing circuit operations is disposed within a substrate or within an interposer. The apparatus further includes second means for performing circuit operations. The second means for performing circuit operations is disposed within the interposer, and the first means for performing circuit operations and the second means for performing circuit operations have a stacked configuration.

In another particular example, a computer-readable medium stores data which is usable by fabrication equipment to fabricate a device. The device includes a first device that is disposed within a substrate of the device or within an interposer of the device. The operations further include forming a second device within the interposer. The first device and the second device have a stacked configuration.

One particular advantage provided by at least one of the disclosed aspects is increased efficiency of circuit area use by relocating (or "offloading") one or more devices to a stack region (e.g., an interposer). Stacking devices in such a manner may increase available circuit area of a substrate (e.g., so that more circuitry can be formed using the substrate) or may enable decreased size of an integrated circuit (e.g., a smaller substrate may be enabled by vertically stacking devices). Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
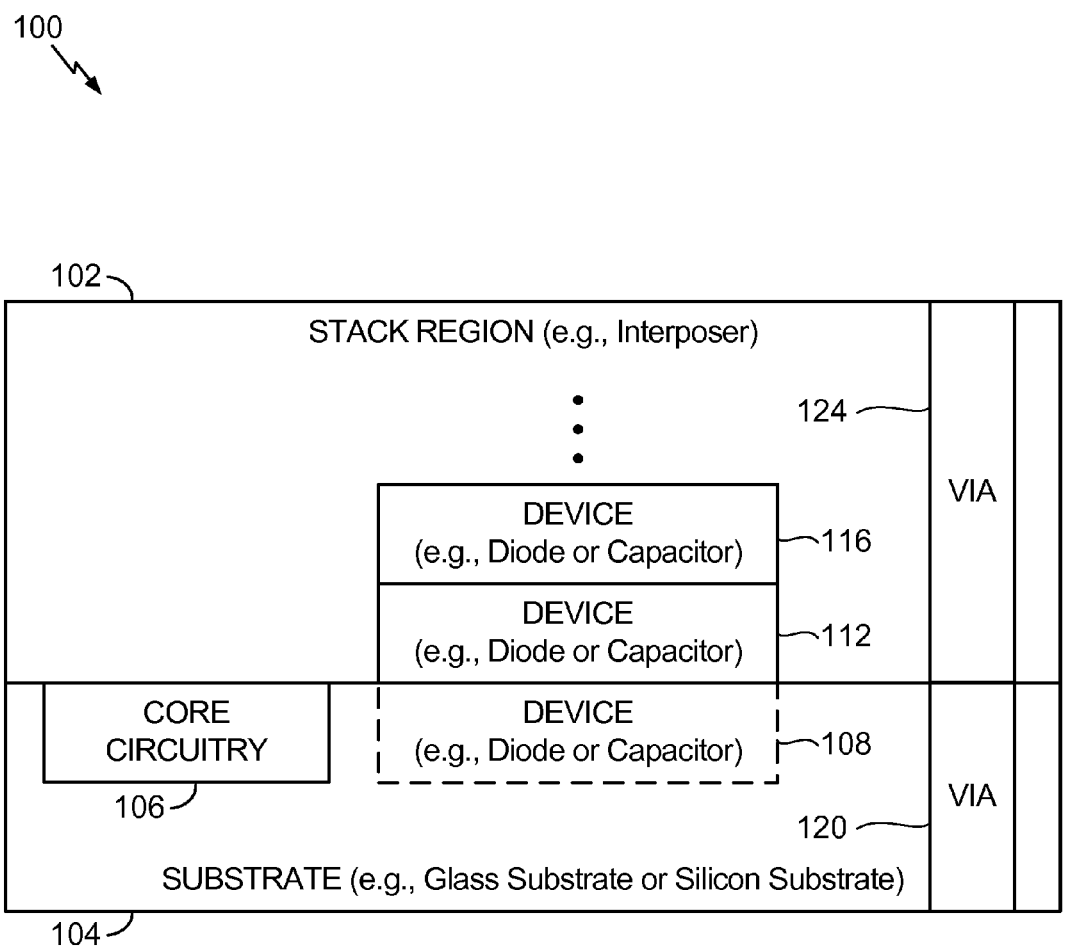
FIG. 1 is a block diagram of a particular illustrative aspect of an electronic device that includes stacked devices.

FIG. 1 illustrates an electronic device 100. The electronic device 100 includes a stack region 102 and a substrate 104.

The substrate 104 may correspond to a silicon substrate or a glass substrate and may be included in a die (e.g., a semiconductor die cut from a semiconductor wafer). The stack region 102 may include a glass material, an isolation material, or a dielectric material, such as an oxide, a nitride, and/or a polymer, as illustrative examples. The substrate 104 may include core circuitry 106 and a via 120. The via 120 may be a through-substrate via (TSV) (or through-silicon via) that is disposed within (e.g., extends through) the substrate 104. The stack region 102 may include a via 124. The via 124 may extend through the stack region 102.

The stack region 102 and the substrate 104 include devices 108, 112, and 116 that are arranged in a stacked configuration. In FIG. 1, the device 108 is formed within the substrate 104, the device 112 is formed on (e.g., "stacked" on) the device 108, and the device 116 is formed on the device 112. It should be appreciated that the electronic device 100 may include more than or fewer than three devices (e.g., two devices, four devices, etc.).

Although FIG. 1 illustrates that the devices 112, 116 are stacked on the device 108, it should be appreciated that other configurations are within the scope of the disclosure. For example, the devices 112, 116 may be stacked on the core circuitry 106 in some applications. Such a configuration may be advantageous in applications in which any of the devices 112, 116 includes an electrostatic discharge (ESD) protection diode that protects the core circuitry 106. In this case, distance (and length of interconnections) between the core circuitry 106 and the devices 112, 116 may be reduced by stacking the devices 112, 116 on the core circuitry 106. In other cases, the devices 112, 116 may be formed above an "empty" region of the substrate 104 that does not include an active circuit region, such as if the substrate 104 is a glass substrate. In other configurations, such as in the example of FIG. 1, the devices 108, 112, and 116 have a stacked configuration. This configuration may be advantageous where one or more of the devices 108, 112, and 116 includes a decoupling capacitor. For example, by positioning the devices 108, 112, and 116 away from the core circuitry 106, noise signals can be isolated away from the core circuitry 106 and reduced (e.g., filtered to ground using the one or more decoupling capacitors). In this case, performance of the core circuitry 106 may be improved by positioning the devices 108, 112, and 116 further away from the core circuitry 106. Thus, the particular stacked configuration may be selected based on the particular application.

The stack region 102 may correspond to an interposer that connects the electronic device 100 to one or more other devices. For example, a second electronic device may be coupled to the stack region 102. The second electronic device may be operationally coupled to any of the devices 108, 112, and 116 through the vias 120, 124, such as by using metallization and/or interconnects in the stack region 102 and/or the substrate 104 (not shown). Alternatively or in addition, an electronic device may be coupled to the substrate 104 and may be operationally coupled to any of the devices 108, 112, and 116 through the vias 120, 124. As used herein, "interposer" may refer to a device that is configured to operatively couple other devices, such as integrated circuit dies. An interposer may have a size and a shape selected based on the particular application (e.g., based on a number of devices included in the interposer, based on a package size of a package in which the interposer is to be integrated, based on sizes of integrated circuit dies to which the interposer is to be connected, or a combination thereof, as illustrative examples).

The stack region 102 is associated with (e.g., is connected to) the substrate 104. For example, the stack region 102 may be attached (e.g., bonded) to the substrate 104 directly or indirectly (e.g., by being attached to one or more layers formed on the substrate 104, such as one or more interlayer dielectrics, one or more metal layers, one or more interconnect layers, or one or more other layers). As another example, the stack region 102 may be formed on the substrate 104 (e.g., using deposition processes to deposit materials of the stack region 102 on the substrate 104, or on a layer that is formed on the substrate 104).

Any of the devices 108, 112, and 116 may include a diode, a capacitor, or another device. For example, the substrate 104 may include a silicon material, and the device 108 may include a diode or a capacitor that is formed by doping the silicon material (e.g., to form a p-n junction or to form a "plate" of a capacitor). The devices 112, 116 may be formed using a thin film deposition process, such as by sputtering a low-temperature polysilicon (LTPS) material on the substrate 104. In this example, one or more of the devices 112, 116 may include a thin film diode, such as a thin film ESD protection diode. Alternatively or in addition, one or more of the devices 112, 116 may include a thin film capacitor, such as a thin film decoupling capacitor. For example, the device 112 may include a thin film capacitor, and the device 116 may include a thin film diode stacked on the thin film capacitor. As another example, the device 112 may include a thin film diode, and the device 116 may include a thin film capacitor stacked on the thin film diode). In other examples, any of the devices 108, 112, and 116 may include one or more other structures. For example, the device 108 may include a transistor, such as an n-type metal-oxide-semiconductor field-effect transistor (nMOSFET) or a p-type metal-oxide-semiconductor field-effect transistor (pMOSFET), as illustrative examples.

To further illustrate, Table 1 provides five non-limiting example configurations of the electronic device 100. It should be appreciated that Table 1 is illustrative and that modifications of the examples of Table 1 and other configurations not represented in Table 1 are within the scope of the disclosure.

TABLE 1

| Example | Device 108 | Device 112 | Device 116 | Connection between devices | Advantage(s) |
|---|---|---|---|---|---|
| 1 | np-type Diode (silicon substrate) | Contact to np-type Diode | np-type diode | Diodes connected in parallel | Reduced series diode resistance |
| 2 | p-type Schottky diode (silicon substrate) | Contact to Schottky diode | n-type Schottky diode | Connected to I/O pad | ESD protection with reduced area |
| 3 | Trench capacitor | Contact to trench capacitor | Schottky diode or junction diode of either polarity | Not connected | DeCap and diode in a common area |
| 4 | None | Thin film diode | Thin film diode | Connected in parallel | Reduced diode series resistance |

TABLE 1-continued

| Example | Device 108 | Device 112 | Device 116 | Connection between devices | Advantage(s) |
|---|---|---|---|---|---|
| 5 | None | Thin film diode having a first polarity | Thin film diode having a second polarity opposite the first polarity | Connected to I/O pad | ESD protection with reduced area |

In Example 1, the device 108 is a diode, such as an n-p junction diode ("np-type diode"). In this example, the substrate 104 may be a silicon substrate, and the device 108 may be formed within the substrate 104 (e.g., by creating an n-type highly doped region in the substrate 104 and a p-type highly doped region in the substrate 104). Example 1 also indicates that the device 116 may include a diode (e.g., an np-type diode and/or a diode formed using a thin film deposition process). The device 112 may include one or more contacts that connect the devices 108, 116. For example, the device 112 may include contacts that connect the devices 108, 116 in parallel so that a first node or wire is connected to the devices 108, 116 and also so that a second node or wire is also connected to the devices 108, 116. The devices 108, 116 may thus be arranged in a stacked configuration. For a particular circuit area, the devices 108, 116 may have a reduced diode series resistance as compared to other device arrangements, such as a configuration where each diode is formed "side-by-side" within a substrate (i.e., the devices 108, 116 may have a greater channel area as compared to such a side-by-side arrangement, thus decreasing the diode series resistance). Accordingly, a device in accordance with Example 1 may improve ESD protection (due to lower resistance) as compared to a device with "side-by-side" diodes.

Example 2 indicates that the device 108 may include p-type diode, such as a p-type Schottky diode. In this example, the substrate 104 may be a silicon substrate, and the device 108 may be formed within the substrate 104 (e.g., by creating a p-type highly doped region in the substrate 104). Example 2 also indicates that the device 116 may include a diode (e.g., a diode formed using a thin film deposition process). The device 112 may include one or more contacts that connect the devices 108, 116. For example, the device 112 may include contacts that connect the devices 108, 116 to a pad region of the electronic device 100 (e.g., using one or more wires or interconnects). For example, the electronic device 100 may include an integrated circuit having a pad area, and the devices 108, 116 may include Schottky diodes configured to provide ESD protection for the pad area or for the substrate 104 (e.g., by shunting current from the pad area and through the substrate in response to an ESD event, or vice versa). In this case, the devices 108, 116 may have a reduced diode series resistance as compared to other device arrangements, such as a "side-by-side" diode configuration. Accordingly, a device in accordance with Example 2 may improve ESD protection (due to lower resistance) as compared to a device with such "side-by-side" devices.

Example 3 indicates that the device 108 may include one or more capacitors, such as a trench capacitor of a dynamic random access memory (DRAM) device. To illustrate, the device 108 may include a first trench layer (e.g., a highly doped region forming a first "plate" of the trench capacitor). The first trench layer may be adjacent to the substrate 104, and the substrate 104 may be a silicon substrate. The device 108 may further include a dielectric material deposited on the first trench layer and a second trench layer (e.g., a conductive region, such as a metal contact that forms a second "plate" of the trench capacitor). Example 3 also indicates that the device 116 may include a diode (e.g., a Schottky diode or a junction-type diode of either polarity). The device 112 may include one or more contacts, such as a contact that connects the device 108 to another device (e.g., to the device 116, or to another device not shown in FIG. 1). Example 3 thus illustrates that the devices 108, 116 may include a capacitor and a diode. The capacitor and the diode may have a stacked configuration that reduces circuit area as compared to a "side-by-side" configuration in which both a capacitor and a diode are formed in a substrate.

In certain implementations, the device 108 may be omitted from the electronic device 100. As an illustrative example, the device 108 may be omitted from the electronic device 100 in connection with a glass substrate implementation of the substrate 104. In Examples 4 and 5, the substrate 104 does not include the device 108.

Example 4 indicates that the devices 112, 116 may each include a thin film diode. For example, the substrate 104 may be a glass substrate, and the devices 112, 116 may include thin film diodes that are formed on the glass substrate using a thin film deposition process. The stack region 102 may then be formed on the substrate 104 after fabrication of the devices 112, 116 (e.g., by forming an isolation or dielectric material, such as an oxide, a nitride, and/or a polymer, as illustrative examples). Alternatively, the thin film diodes may be formed within the stack region 102 (e.g., using a thin film deposition process), and the stack region 102 may be attached to the substrate 104 after formation of the thin film diodes (e.g., using a bonding process, an adhesive, and/or another technique). In a particular implementation, the devices 112, 116 are connected in parallel using contacts formed within the stack region 102 (not shown in FIG. 1). For example, a first node or wire may be connected to the devices 108, 116 and a second node or wire may also connected to the devices 108, 116 so that the devices 108, 116 are connected in parallel. Because the devices 112, 116 have a stacked configuration, the devices 112, 116 have a reduced diode series resistance (for a particular circuit area) as compared to "side-by-side" devices that occupy a similar circuit area.

Example 5 illustrates that the devices 112, 116 may include thin film diodes of different polarities. For example, the device 112 may include a thin film diode having a first polarity, and the device 116 may include another thin film diode having a second polarity that is opposite to the first polarity. The substrate 104 may be a glass substrate, and the devices 112, 116 may be formed on the glass substrate using a thin film deposition process. The stack region 102 may then be formed on the substrate 104 after fabrication of the devices 112, 116 (e.g., by forming an isolation or dielectric material, such as an oxide, a nitride, and/or a polymer, as illustrative examples). Alternatively, the devices 112, 116 may be formed within the stack region 102 (e.g., using a thin film deposition process), and the stack region 102 may be attached to the substrate 104 after formation of the devices 112, 116 (e.g., using a bonding process, an adhesive, and/or another technique). In a particular implementation, the stack region 102 includes contacts that connect the devices 112, 116 to a pad region of the electronic device 100. For example, the electronic device 100 may include an integrated circuit having a pad area, and the devices 112, 116 may include thin film diodes configured to provide ESD protection for the pad area or for the substrate 104 (e.g., by shunting current from the pad area and through the substrate in response to an ESD event, or vice versa). In a particular aspect, the different polarities of the thin film devices provide ESD protection for both the substrate 104 and the pad region. For example, the first polarity may enable discharge of current from the pad area to the substrate 104, and the second polarity may enable discharge of current from the substrate to the pad area (or vice versa). The devices 112, 116 may have a reduced diode series resistance (for similar circuit area) as compared to other device arrangements, such as a "side-by-side" diode configuration. Accordingly, a device in accordance with Example 5 may improve ESD protection (due to lower resistance for a similar circuit area) as compared to a device with such "side-by-side" devices.

FIG. 1 illustrates that the devices 112, 116 can be "offloaded" from the substrate 104 to the stack region 102. The vias 120, 124 enable communication between the devices 108, 112, and 116. Thus, circuit area of the substrate 104 is conserved by "offloading" devices to the stack region 102 (e.g., to increase area available to the core circuitry 106).

Further, an ESD protection diode and a decoupling capacitor may be formed using a thin film deposition process. Certain glass substrate devices may use thin film deposition processes to form components. However, glass substrate devices do not conventionally employ ESD protection and decoupling capacitors. By using a thin film process to form an ESD protection diode and/or a decoupling capacitor in a stacked configuration, area of the ESD protection diode and/or area of the decoupling capacitor may be increased without increasing on-chip circuit area, thus improving device operation (e.g., by reducing diode resistance and/or by increasing capacitance for a similar on-chip circuit area of the substrate 104).

As described further with reference to FIGS. 2-5, the stack region 102 may include one or more metal layers and one or more vias that connect the one or more metal layers. For example, the device 112 may be formed in or underneath a first metal layer, and the device 116 may be formed in or underneath a second metal layer. Depending on the particular application, the device 112 may be coupled to the device 116 by one or more vias of the stack region 102. Although certain structures are omitted from FIGS. 1-5 for convenience (e.g., wires and/or interconnections), it should be appreciated that FIGS. 1-5 are illustrative and may include one or more components not illustrated. Further, connections and structures illustrated in FIGS. 1-5 may be modified without departing from the scope of the disclosure.

Figure 2:
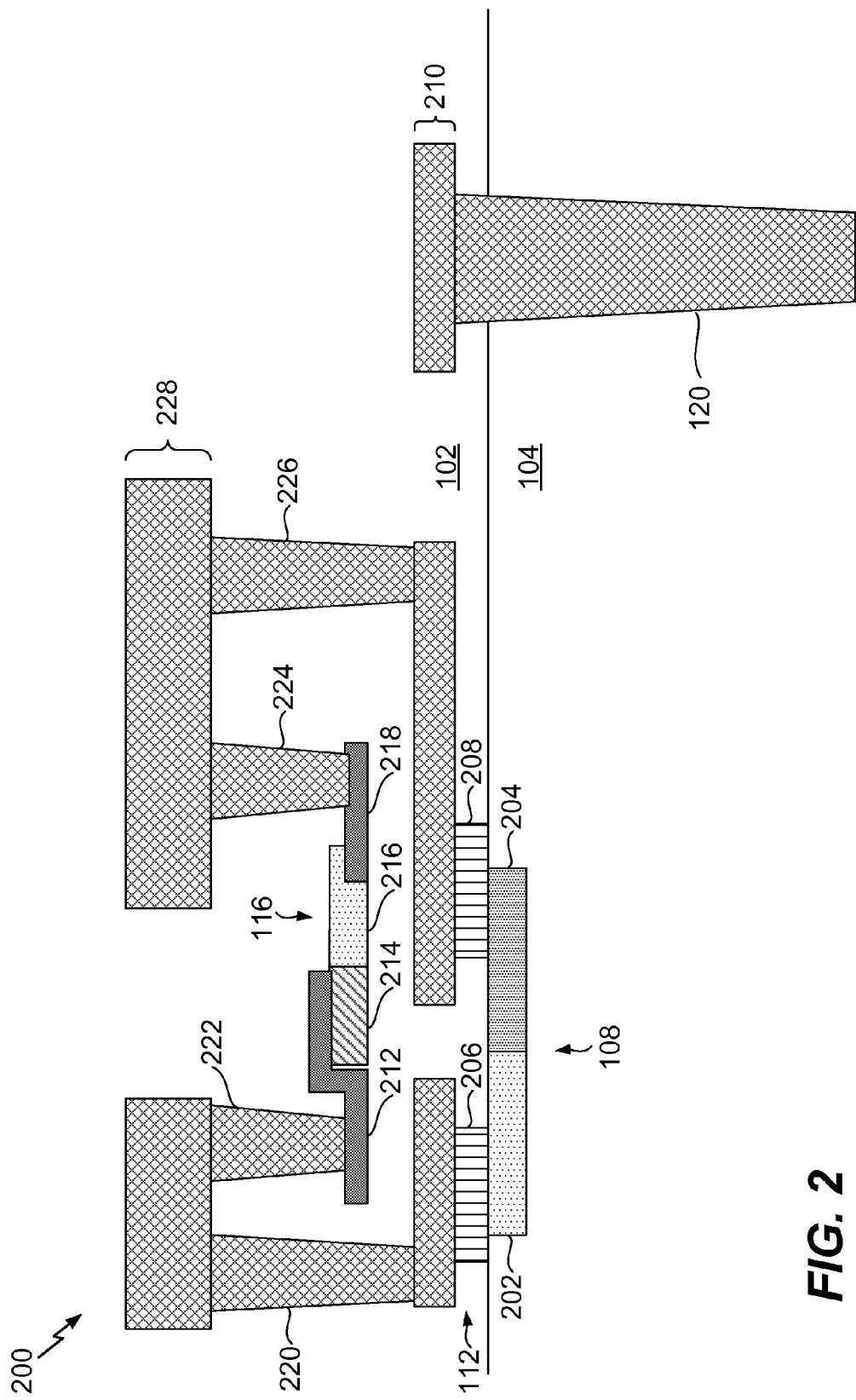
FIG. 2 illustrates a particular illustrative aspect of the electronic device of FIG. 1.

FIG. 2 illustrates a particular illustrative aspect of an electronic device 200. The electronic device 200 may correspond to the electronic device 100 of FIG. 1. For example, the electronic device 200 may include the stack region 102 and the substrate 104 of FIG. 1. The substrate 104 may include the device 108 and the via 120. The stack region 102 may include the devices 112, 116.

In the example of FIG. 2, the device 108 is a junction diode that includes a region 202 and a region 204. In a particular aspect, the device 108 is a semiconductor-semiconductor junction diode (e.g., an n-p junction diode or a p-n junction diode). In this example, the region 202 may correspond to an n-type highly doped region, and the region 204 may correspond to a p-type doped region (or vice versa). In another implementation, the device 108 is a metal-semiconductor junction diode (e.g., a Schottky diode). In this case, the region 202 may correspond to a highly doped region (e.g., an n-type highly doped region or a p-type highly doped region), and the region 204 may correspond to a metal region (or vice versa). It should be appreciated that in the case of a metal-semiconductor junction diode, a metal region may be deposited on the substrate 104 (e.g., the region 204 may be formed by a metal that is deposited on a surface of the substrate 104 or within a trench of the substrate 104). In another example, the regions 202, 204 are of a same polarity (e.g., n-type or p-type) and form a semiconductor portion of a metal-semiconductor junction diode, and one of the contacts 206, 208 forms a metal portion of the metal-semiconductor junction diode.

The example of FIG. 2 further illustrates that the device 112 may include contacts 206, 208. The contacts 206, 208 are positioned between the device 112 and a first patterned metal layer (M1) 210. The electronic device 100 further includes vias 220, 222, 224, and 226 and a second patterned metal layer (M2) 228.

The device 116 may include a region 214 and a region 216. The regions 214, 216 may include thin film materials that are deposited using a thin film deposition process. Although not shown in FIG. 2, it should be appreciated that the stack region 102 may include one or more dielectric or isolation materials. For example, the regions 214, 216 may be formed on a dielectric material (e.g., an interlayer dielectric between the first patterned metal layer 210 and the second patterned metal layer 228). The device 116 may be connected to the vias 222, 224 by conductive regions 212, 218 (e.g., aluminum and/or copper materials). Further, one or more additional devices may be stacked above the second patterned metal layer 228 (not shown in FIG. 2).

The example of FIG. 2 illustrates that the stack region 102 can be used to stack multiple diodes in a stacked configuration. For example, by using multiple diodes, ESD protection can be increased (e.g., doubled) as compared to "side-by-side" substrate diode configurations without increasing an area of the substrate 104.

Figure 3:
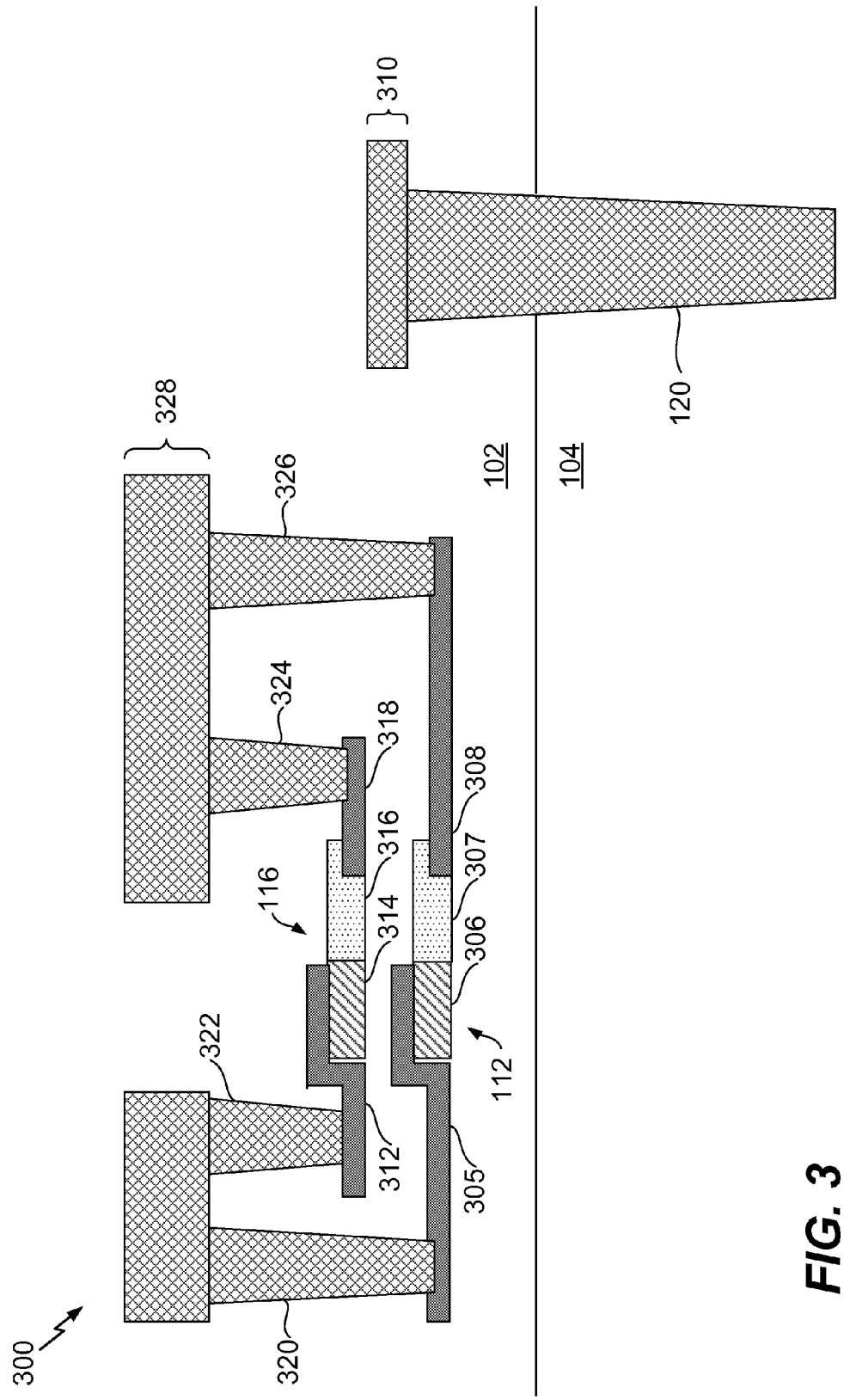
FIG. 3 illustrates another particular illustrative aspect of the electronic device of FIG. 1.

FIG. 3 illustrates a particular illustrative aspect of an electronic device 300. The electronic device 300 may correspond to the electronic device 100 of FIG. 1. For example, the electronic device 300 may include the stack region 102 and the substrate 104 of FIG. 1. The substrate 104 may include the via 120. The stack region 102 may include the devices 112, 116.

In the example of FIG. 3, the device 112 may correspond to a thin film diode that includes a region 306 and a region 307. The regions 306, 307 may include thin film materials that are deposited using a thin film deposition process. Although not shown in FIG. 2, it should be appreciated that the stack region 102 may include one or more dielectric or isolation materials. For example, the regions 306, 307 may be formed on a dielectric material. In other implementations, the regions 306, 307 may be formed directly on the substrate 104.

The electronic device 300 may further include a first patterned metal layer (M1) 310, conductive regions 305, 308 (e.g., aluminum and/or copper materials), and vias 320, 322, 324, and 326. In the example of FIG. 3, the device 116 may correspond to a thin film diode that includes a region 314 and a region 316. The regions 314, 316 may include thin film materials that are deposited using a thin film deposition process. The regions 314, 316 may be connected to the vias 322, 324 by conductive regions 312, 318 (e.g., aluminum and/or copper materials). The vias 322, 324 may be connected to a second patterned metal layer (M2) 328. Further, one or more additional devices may be stacked above the second patterned metal layer 328 (not shown in FIG. 3).

The devices 112, 116 may include thin film diodes having widths selected to achieve a particular ESD protection characteristic (e.g., resistance). For example, by increasing a width of a thin film diode, resistance of the thin film diode is decreased (due to a greater channel area). Further, in a stacked die three-dimensional (3D) implementation, circuit area overhead may be limited, and thus widening thin film diodes to achieve a particular ESD protection characteristic (instead of extending diode height) may be advantageous. Although the example of FIG. 3 illustrates two thin film diodes, it should be appreciated that the electronic device 300 may include any number of thin film diodes (e.g., one thin film diode, three thin film diodes, or another number of thin film diodes). The number of thin film diodes may be selected to achieve a particular diode resistance.

FIG. 3 illustrates that the devices 112, 116 may include thin film diodes formed within the stack region 102 using a thin film deposition process. By stacking thin film diodes in the stack region 102, the thin film diodes can be widened as compared to a "side-by-side" diode configuration in which diodes are formed adjacently within a substrate. Because thin film materials may be associated with poorer ESD characteristics as compared to silicon-based diodes, widening the thin film diodes may improve performance in applications in which one or both of the thin film diodes function as an ESD protection diode.

Figure 4:
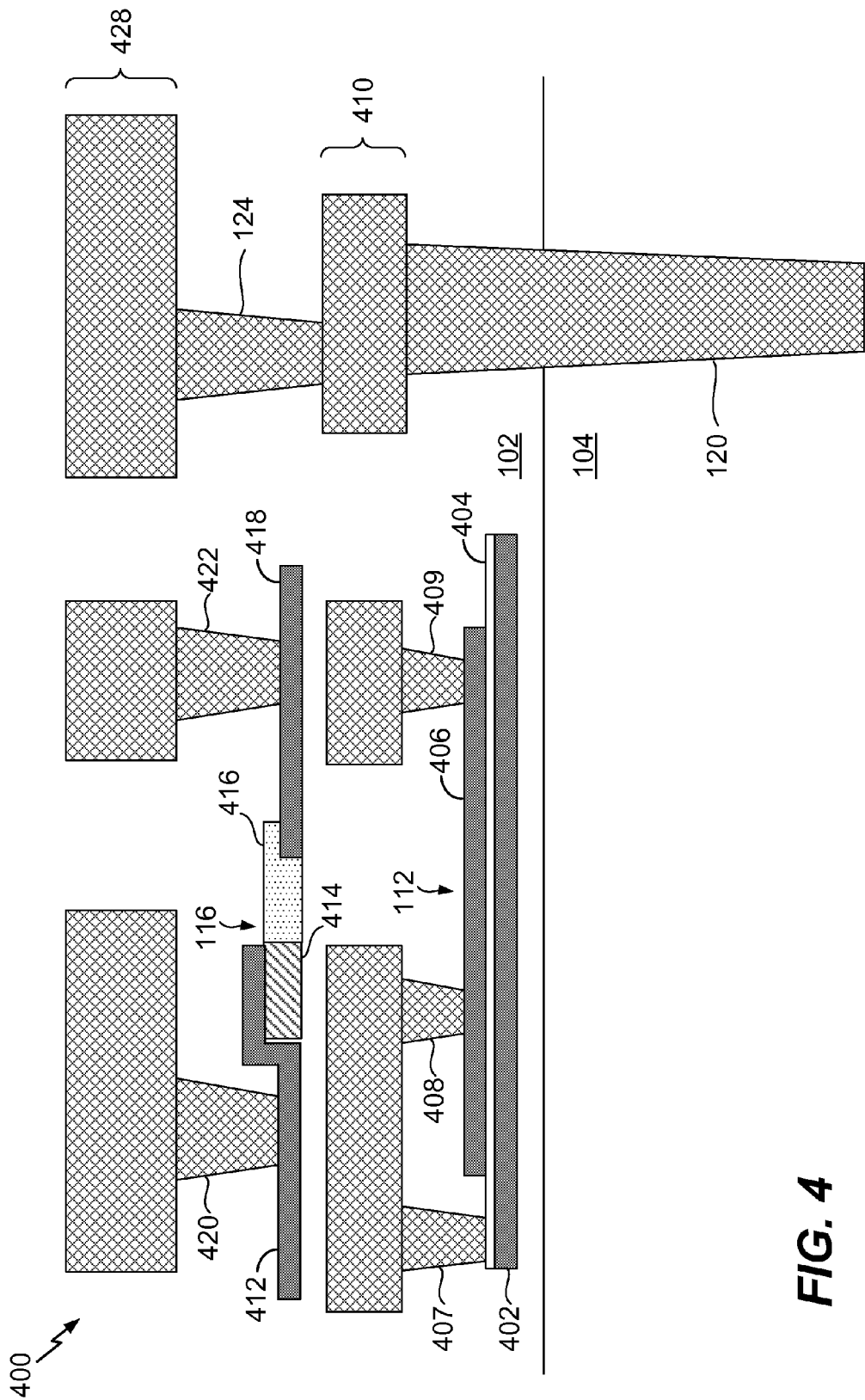
FIG. 4 illustrates another particular illustrative aspect of the electronic device of FIG. 1.

FIG. 4 illustrates a particular illustrative aspect of an electronic device 400. The electronic device 400 may correspond to the electronic device 100 of FIG. 1. For example, the electronic device 400 may include the stack region 102 and the substrate 104 of FIG. 1. The substrate 104 may include the via 120. The stack region 102 may include the devices 112, 116 and the via 124.

In the example of FIG. 4, the device 112 may correspond to a planar capacitor, such as a decoupling capacitor (decap). In this example, the device 112 may include a plate 402, a plate 406, and a dielectric layer 404 (e.g., nitride, oxide, and/or another material) between the plates 402, 406.

The device 112 may be coupled to one or more structures of the electronic device 400 by one or more vias. For example, FIG. 4 illustrates that the device 112 may be connected to vias 407, 408, and 409, which may be connected to a first patterned metal layer (M1) 410. The first patterned metal layer 410 may be connected to one or more other components via one or more other connections (not shown in FIG. 4). It should be appreciated that the configuration illustrated in FIG. 4 is illustrative and that other structures are within the scope of the disclosure. For example, in a particular aspect, the via 407 is connected to the plate 402. In this example, the plates 402, 406 may be biased using different potentials, such as by applying a supply voltage to the plate 402 using the via 407 and by applying a ground potential to the plate 406 using the via 408. Alternatively, the electronic device 400 may have another configuration.

In the example of FIG. 4, the device 116 may correspond to a thin film diode that includes a region 414 and a region 416. The regions 414, 416 may include thin film materials that are deposited using a thin film deposition process. The regions 414, 416 may be connected to vias 420, 422 by conductive regions 412, 418 (e.g., aluminum and/or copper materials). The vias 420, 422 may be connected to a second patterned metal layer (M2) 428. The second patterned metal layer 428 may be connected to one or more other structures.

One or more additional devices may be stacked above the second patterned metal layer 428 (not shown in FIG. 4).

FIG. 4 illustrates that the stack region 102 may enable both diode and capacitor functions. For example, the device 112 may function as a planar decap configured to filter "noise" (e.g., high frequency signals), and the device 116 may function as a diode, such as an ESD protection diode.

Figure 5:
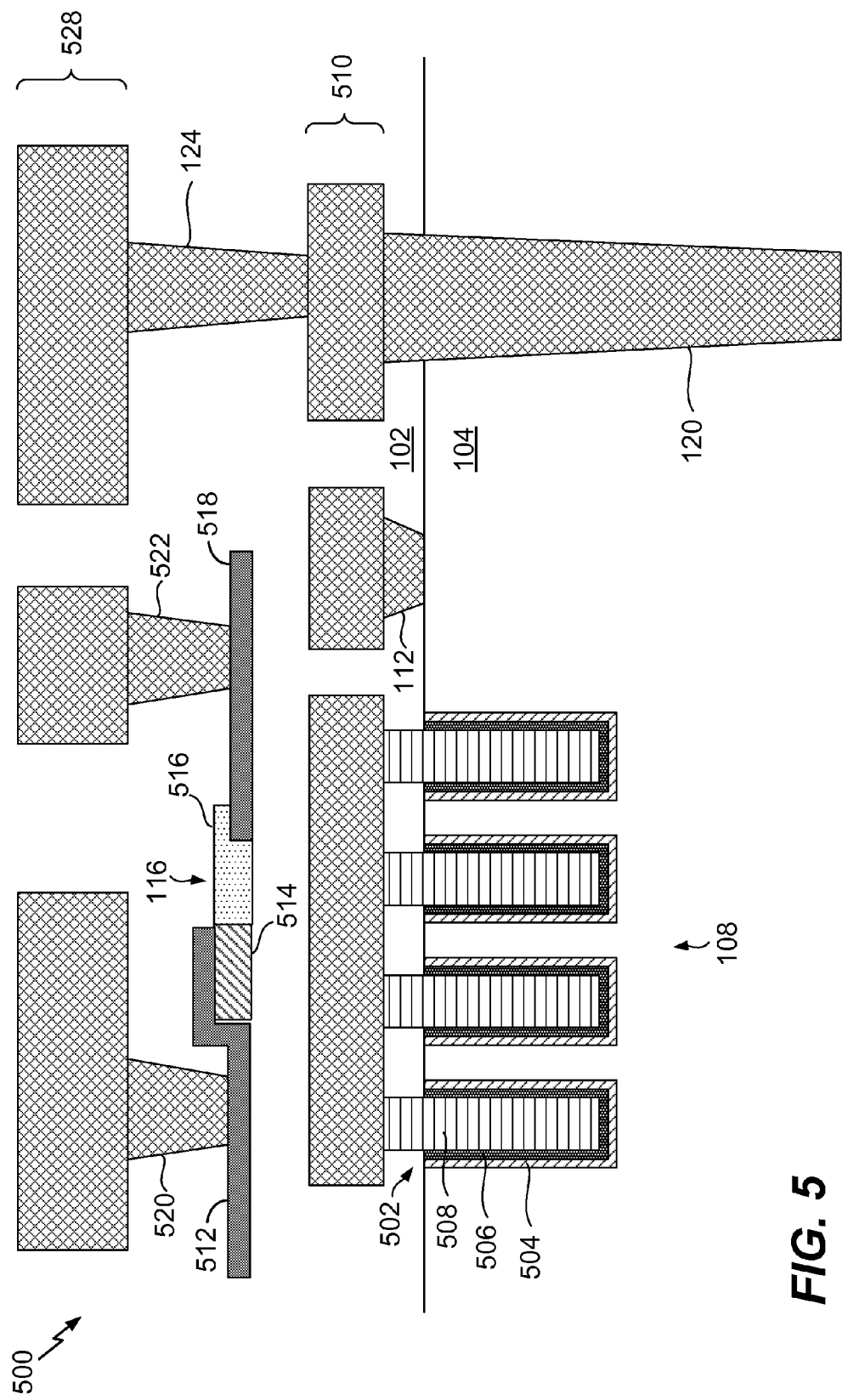
FIG. 5 illustrates another particular illustrative aspect of the electronic device of FIG. 1.

FIG. 5 illustrates a particular illustrative aspect of an electronic device 500. The electronic device 500 may correspond to the electronic device 100 of FIG. 1. For example, the electronic device 500 may include the stack region 102 and the substrate 104 of FIG. 1. The substrate 104 may include the device 108 and the via 120. The stack region 102 may include the devices 112, 116 and the via 124.

In the example of FIG. 5, the device 108 includes one or more capacitors, such as one or more trench capacitors formed in the substrate 104. The one or more trench capacitors may be included in a dynamic random access memory (DRAM) device, as an illustrative example. In this example, one or more trench capacitors may be included in one or more respective DRAM storage elements of the DRAM device. Alternatively or in addition, the one or more trench capacitors may operate in connection with one or more other applications, such as in connection with a decoupling capacitor (decap) application. In this example, one or more of the trench capacitors may include a decap. It will be further appreciated that a capacitor can be used in other applications, such as in connection with a resistive-capacitive (RC) timer circuit, as an illustrative example.

To illustrate, FIG. 5 depicts a representative trench capacitor 502 formed in a trench of the substrate 104. After formation of the trench (e.g., using an etch process), a first trench layer 504 may be deposited in the trench. The first trench layer may correspond to a highly doped region forming a first "plate" of the trench capacitor 502. The device 108 may further include a dielectric material 506 deposited on the first trench layer 504. The device 108 may further a second trench layer 508 (e.g., a conductive region, such as a metal contact that forms a second "plate" of the trench capacitor 502). The second trench layer 508 may be deposited on the dielectric material 506. One or more trench capacitors of the device 108 may be connected to a first patterned metal layer (M1) 510. In the example of FIG. 5, the device 108 includes four trench capacitors corresponding to the trench capacitor 502. In other examples, the device 108 may include a different number of trench capacitors and/or a different configuration of trench capacitors.

In the example of FIG. 5, the device 112 includes a contact coupled to the first patterned metal layer 510 and to the substrate 104. In this example, the device 112 may be configured to bias the first trench layers of trench capacitors (e.g., the first trench layer 504 of the trench capacitor 502) via the substrate 104, such as by applying a ground potential to the first trench layers of the trench capacitors. The second trench layers of the trench capacitors (e.g., the second trench layer 508 of the trench capacitor 502) may be biased through the first patterned metal layer 510, such as by applying a supply voltage to a portion of the first patterned metal layer 510 that is connected to the second trench layers.

In FIG. 5, the device 116 may correspond to a thin film diode that includes a region 514 and a region 516. The regions 514, 516 may include thin film materials that are deposited using a thin film deposition process. The regions 514, 516 may be connected to vias 520, 522 by conductive regions 512, 518 (e.g., aluminum and/or copper materials). The vias 520, 522 may be connected to a second patterned metal layer (M2) 528. The second patterned metal layer 528 may be connected to one or more other structures. One or more additional devices may be stacked above the second patterned metal layer 528 (not shown in FIG. 5).

The example of FIG. 5 illustrates an example implementation in which the device 108 includes circuitry (e.g., one or more capacitors) and in which the device 116 includes a diode having a stacked configuration with respect to the device 108. Although FIG. 5 illustrates that the device 108 may include capacitors, it is noted that the device 108 may include other circuitry (e.g., transistors or other devices) depending on the particular application.

FIGS. 1-5 describe illustrative implementations of stacked devices. Although the examples of FIGS. 1-5 are described separately for convenience of description, it should be appreciated that an electronic device may include any combination of (or modification to) the example structures of FIGS. 1-5. As an illustrative example, an electronic device may include structures of each of the electronic devices 100, 200, 300, 400, and 500.

Figure 6:
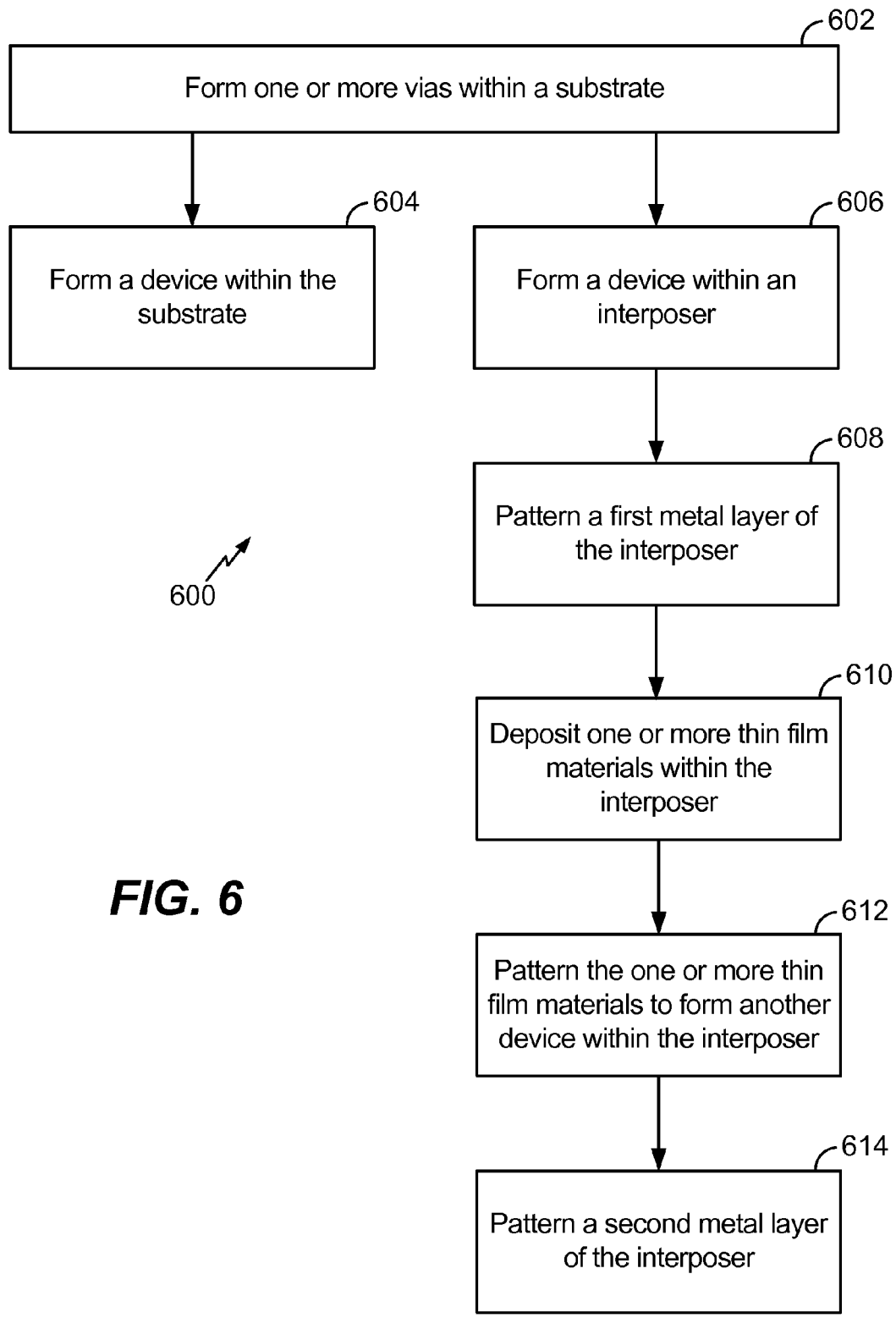
FIG. 6 is a flow chart of a particular illustrative aspect of a method of fabricating an electronic device that includes stacked devices.

Referring to FIG. 6, a particular illustrative aspect of a method of fabricating an electronic device is depicted and generally designated 600. For example, the method 600 may be performed to fabricate any of the electronic devices 100, 200, 300, 400, and 500, or a combinations thereof.

The method 600 may include forming one or more vias within a substrate, at 602. For example, the one or more vias may include a through-substrate via (or through-silicon via) (TSV), which may be formed within a silicon substrate, such as by etching a trench within the substrate and filling the trench with a conductive material (e.g., a metal, such as copper). The TSV may correspond to the via 120, and the substrate may correspond to the substrate 104.

The method 600 may optionally include forming a device (e.g., the device 108) within the substrate, at 604. To further illustrate, referring again to FIG. 2, the device may include a diode formed by the regions 202, 204, such as a semiconductor-semiconductor junction diode. In this example, forming the device may include forming the regions 202, 204 within the substrate 104, such as by doping, implanting, growing, diffusing, and/or epitaxially creating one or more materials in the substrate 104. In other implementations, the device may be a metal-semiconductor junction diode (e.g., a Schottky barrier diode). In this case, one of the regions 202, 204 may include a metal material formed on the substrate 104 or within a trench of the substrate 104. In another example, the device includes a trench capacitor, such as the trench capacitor 502 of FIG. 5. In other cases, formation of the device within the substrate may be omitted from operations of the method 600. For example, FIGS. 3 and 4 illustrate examples in which a device is not formed within the substrate 104.

The method 600 may further include forming a device (e.g., the device 112) within an interposer (e.g., the stack region 102), at 606. For example, the interposer may include any of the contacts 206, 208. In this example, the contacts 206, 208 may be formed by depositing metal (e.g., copper) on the substrate 104. In another example, the device may include a thin film diode, such as a thin film diode that includes the regions 306, 307 of FIG. 3. As another example, the device may include a thin film capacitor, such as the thin film capacitor described with reference to FIG. 4. In another implementation, the device may include a contact, such as described with reference to FIG. 5.

Depending on the particular application, the interposer may be formed separately from the substrate (and subsequently attached to the substrate), or the interposer may be formed on the substrate (e.g., monolithically). To illustrate, in a particular implementation, the stack region 102 may be formed separately from the substrate 104, and the stack region 102 may be attached to (e.g., bonded to) the substrate 104 after formation of the stack region 102. Alternatively, the stack region 102 may be formed in connection with processes associated with the substrate 104 (e.g., the stack region 102 and the substrate 104 may have a unitary or monolithic arrangement). In some implementations, devices of the substrate and the interposer are formed using certain operations that may be performed in parallel. For example, the device may be formed within the substrate, at 604, in parallel with forming the device within the interposer, at 606. In other implementations, the device may be formed within the substrate, at 604, sequentially with respect to forming the device within the interposer, at 606 (e.g., the device may be formed within the substrate, at 604, prior to forming the device within the interposer, at 606).

The method 600 may further include patterning a first metal layer of the interposer, at 608. To illustrate, the first metal layer may be deposited within the stack region 102, and the first metal layer may be patterned (e.g., drilled, etched, or laser scribed) to define any of the first patterned metal layers 210, 310, 410, and 510. The method 600 may also include patterning a first set of vias. For example, the first set of vias may include any of the vias 220, 226, 320, 326, 407, 408, 409, 520, and 522. To pattern the first set of vias, a dielectric or isolation material of the stack region 102 may be etched, drilled, or laser scribed to define a first set of cavities, and the first set of cavities may be filled with metal (e.g., copper) to form the first set of vias.

The method 600 may further include depositing one or more thin film materials within the interposer (e.g., to form a thin film stack), at 610. To illustrate, any of the regions 214, 216, 314, 316, 414, 416, 514, and 516 may be formed within the stack region 102, such as by depositing the one or more thin film materials on a dielectric material of the stack region 102 using a thin film deposition process.

The method 600 may further include patterning the one or more thin film materials to form another device (e.g., the device 116) within the interposer, at 612. For example, any of the regions 214, 216, 314, 316, 414, 416, 514, and 516 may be etched or otherwise defined to form the device 116. For example, the device may include a thin film diode, such as illustrated in the examples of FIGS. 2-5. In other applications, the device may include one or more other components, such as a thin film capacitor, as an illustrative example.

The method 600 may further include patterning a second metal layer of the interposer, at 614. To illustrate, the second metal layer may be deposited within the stack region 102, and the second metal layer may be patterned (e.g., drilled, etched, or laser scribed) to define any of the second patterned metal layers 228, 328, 428, and 528. The method 600 may also include patterning a second set of vias. For example, the second set of vias may include any of the vias 124, 222, 224, 322, 324, 420, 422, 520, and 522. To pattern the second set of vias, a dielectric or isolation material of the stack region 102 may be etched, drilled, or laser scribed to define a second set of cavities, and the second set of cavities may be filled with metal (e.g., copper) to form one or more of the vias 222, 224.

After completing formation of each device of the stack region 102, a dielectric and/or isolation material may be "filled" in the stack region 102 (e.g., using a growth process or a deposition process). The method 600 may optionally include stacking multiple electronic devices to create a stacked electronic device (e.g., a stacked die three-dimensional device). For example, two or more of the electronic devices 100, 200, 300, 400, and 500 may be stacked to create the stacked electronic device. The stacked electronic device may optionally be integrated within a package to form a system-in-package (SiP) device. For example, a first semiconductor die may be attached to (e.g., bonded to) a first side of an interposer (e.g., the stack region 102), and a second semiconductor die may be attached to (e.g., bonded to) a second side of the interposer. The first die, the second die, and the interposer may be integrated within a package to form an SiP device.

The method 600 illustrates fabrication of an electronic device that includes multiple devices having a stacked configuration. For example, the stack region 102 of FIG. 1 may include the devices 112, 116, and the substrate 104 may include the device 108. The devices 108, 112, and 116 may have a stacked configuration. In this example, three devices (the devices 108, 112, and 116) have a stacked configuration. In other implementations, an electronic device may have a different number of stacked devices (e.g., two stacked devices, or four or more stacked devices). Stacking devices in such a manner may increase available circuit area of a substrate (e.g., so that more circuitry can be formed using the substrate) or may enable decreased size of an integrated circuit (e.g., a smaller substrate may be enabled by vertically stacking devices).

Figure 7:
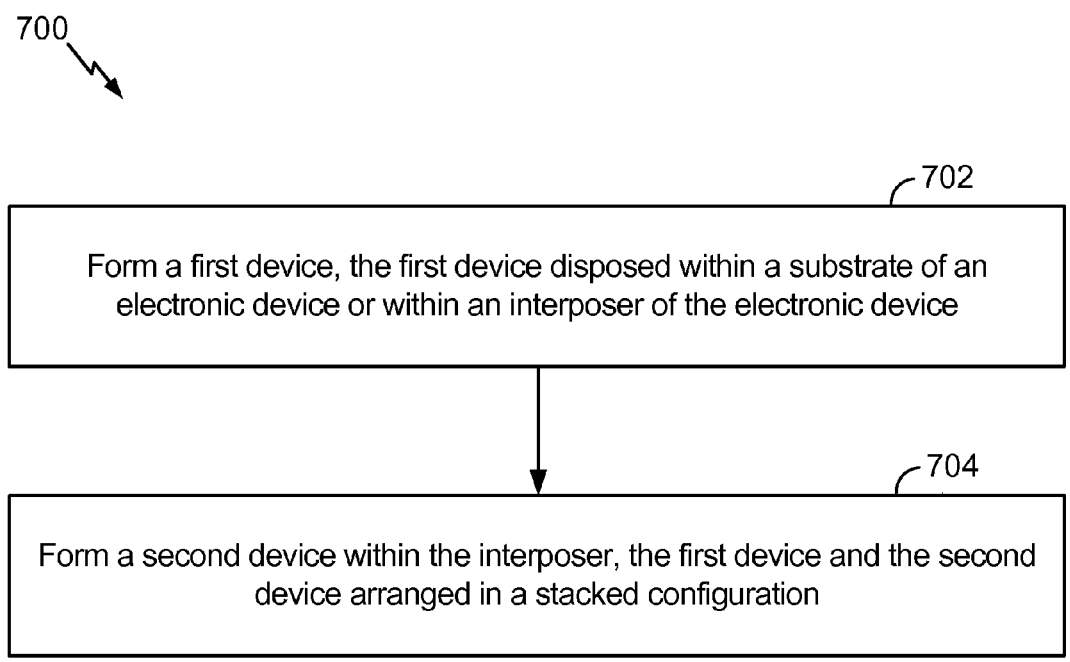
FIG. 7 is a flow chart of another particular illustrative aspect of a method of fabrication of an electronic device that includes stacked devices.

Referring to FIG. 7, another particular illustrative aspect of a method of fabrication of an electronic device is depicted and generally designated 700. The electronic device may correspond to any of the electronic devices 100, 200, 300, 400, and 500.

The method 700 may include forming a first device, at 702. The first device is disposed within a substrate (e.g., the substrate 104) of the electronic device or within an interposer (e.g., the stack region 102) of the electronic device. For example, the device 108 is included in the substrate 104. In this example, the first device may include a device formed within the substrate 104, such as a diode (e.g., as described with reference to FIG. 2) or a trench capacitor (e.g., as described with reference to FIG. 5), as illustrative examples. As another example, the device 112 is included in the interposer. In this example, the first device may include a thin film diode formed within the interposer (e.g., as described with reference to FIG. 3) or a thin film capacitor formed within the interposer (e.g., as described with reference to FIG. 4), as illustrative examples.

The method 700 may further include forming a second device within the interposer, at 704. For example, the first device may correspond to the device 112, and the second device may correspond to the device 116, as illustrative examples. As another example, the first device may correspond to the device 108, and the second device may correspond to the device 112. The first device and the second device have a stacked configuration. The second device may include a thin film diode or a thin film capacitor, such as a planar decoupling capacitor (decap), as illustrative examples. In an illustrative implementation, the first device includes a semiconductor device (e.g., a diode) formed using a doping process, and the second device includes a thin film device formed using a thin film deposition process. In another implementation, the first device and the second device each include a thin film device formed within an interposer (e.g., the stack region 102) using a thin film deposition process.

The method 700 illustrates that an electronic device may include one or more devices formed in a stack region (e.g., an interposer). By "offloading" the one or more devices from a substrate (e.g., the substrate 104) to the stack region, circuit area of the substrate is conserved, which can reduce size and cost of an integrated circuit.

Figure 8:
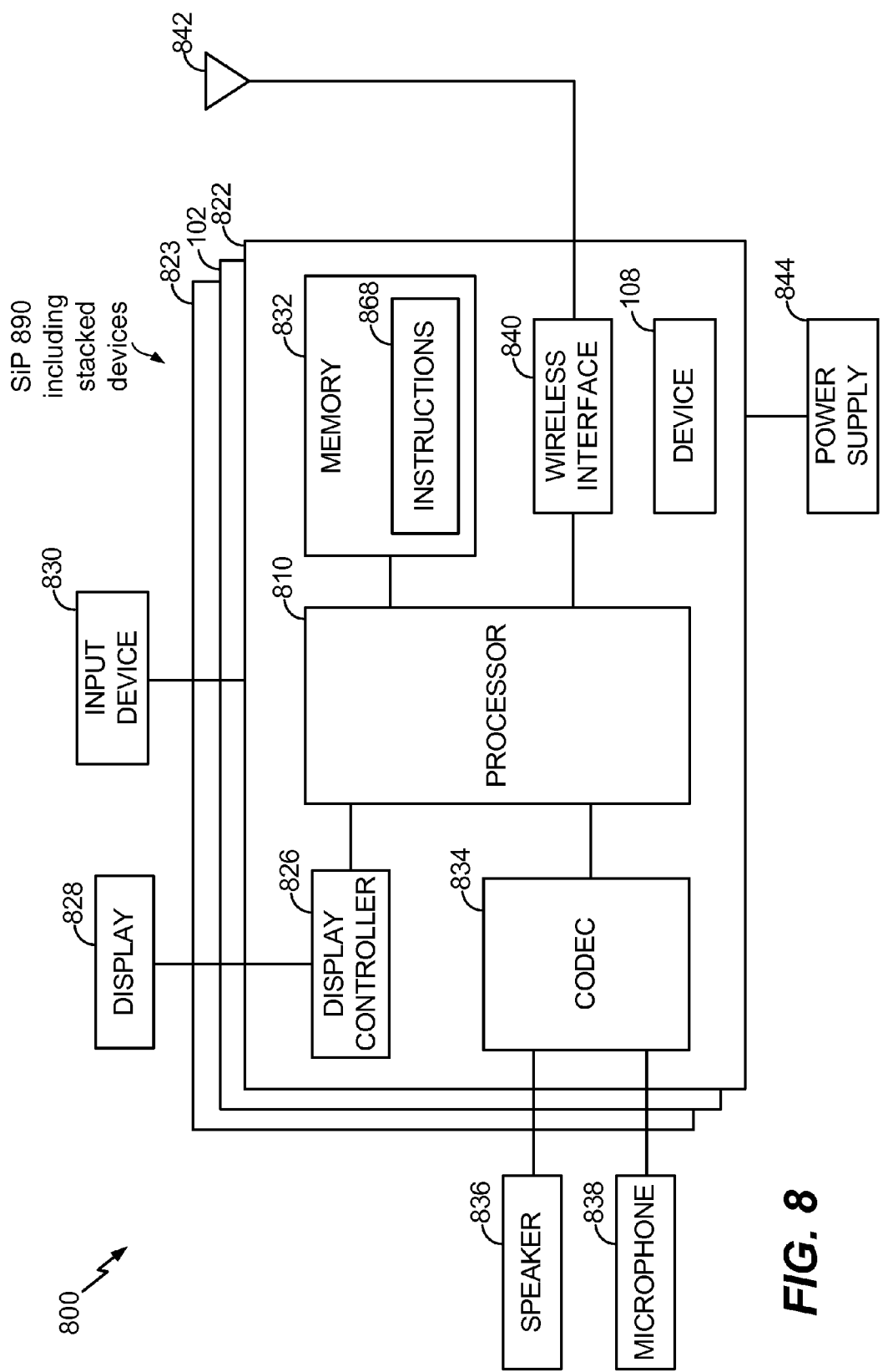
FIG. 8 is a block diagram of an electronic device that includes stacked devices.

Referring to FIG. 8, a block diagram of a particular illustrative aspect of an electronic device is depicted and generally designated 800. The electronic device 800 may correspond to a mobile device (e.g., a cellular telephone), a computer (e.g., a laptop computer, a tablet computer, a notebook computer, or a desktop computer), a set top box, an entertainment unit, a navigation device, a personal digital assistant (PDA), a monitor, a television, a tuner, a radio, a music player, a video player, or a combination thereof, as illustrative examples.

The electronic device 800 may include a first die 822. The first die 822 may include the substrate 104 of FIG. 1. The first die 822 may be coupled to the stack region 102, and the stack region 102 may be coupled to a second die 823. The first die 822, the stack region 102 and the second die 823 may be integrated within an electronic device, such as within a system-in-package (SiP) device 890. The SiP device 890 may include stacked devices. For example, the first die 822 may include the device 108, and the device 108 may be stacked with the devices 112, 116 of the stack region 102 (not shown in FIG. 8 because the first die 822 is positioned in front of the stack region 102 in the view illustrated in FIG. 8). Although the example of FIG. 8 illustrates that the electronic device 800 includes one stack region (the stack region 102) and two dies (the first die 822 and the second die 823), it is noted that the electronic device 800 may include a different number of stack regions and dies (e.g., two stack regions and three dies, as an illustrative example).

The electronic device 800 includes a processor 810, such as a digital signal processor (DSP), a central processing unit (CPU), and/or a graphics processing unit (GPU), as illustrative examples. The electronic device 800 may further include a memory 832. The memory 832 is coupled to the processor 810. The memory 832 includes instructions 868 that are accessible by the processor 810. The instructions 868 may include one or more instructions that are executable by the processor 810.

FIG. 8 also shows a display controller 826 that is coupled to the processor 810 and to a display 828. A coder/decoder (CODEC) 834 can also be coupled to the processor 810. A speaker 836 and a microphone 838 can be coupled to the CODEC 834. FIG. 8 also indicates that a wireless interface 840, such as a wireless controller and/or a transceiver, can be coupled to the processor 810 and to an antenna 842.

One or both of the first die 822 and the second die 823 may correspond to a system-on-chip (SoC) device. For example, in a particular aspect, the device 108, the processor 810, the display controller 826, the memory 832, the CODEC 834, and the wireless interface 840 are included in an SoC device. Further, an input device 830 and a power supply 844 may be coupled to the SoC device. Moreover, in a particular aspect, as illustrated in FIG. 8, the display 828, the input device 830, the speaker 836, the microphone 838, the antenna 842, and the power supply 844 are external to the SoC device. However, each of the display 828, the input device 830, the speaker 836, the microphone 838, the antenna 842, and the power supply 844 can be coupled to a component of the SoC device, such as to an interface or to a controller.

Figure 9:
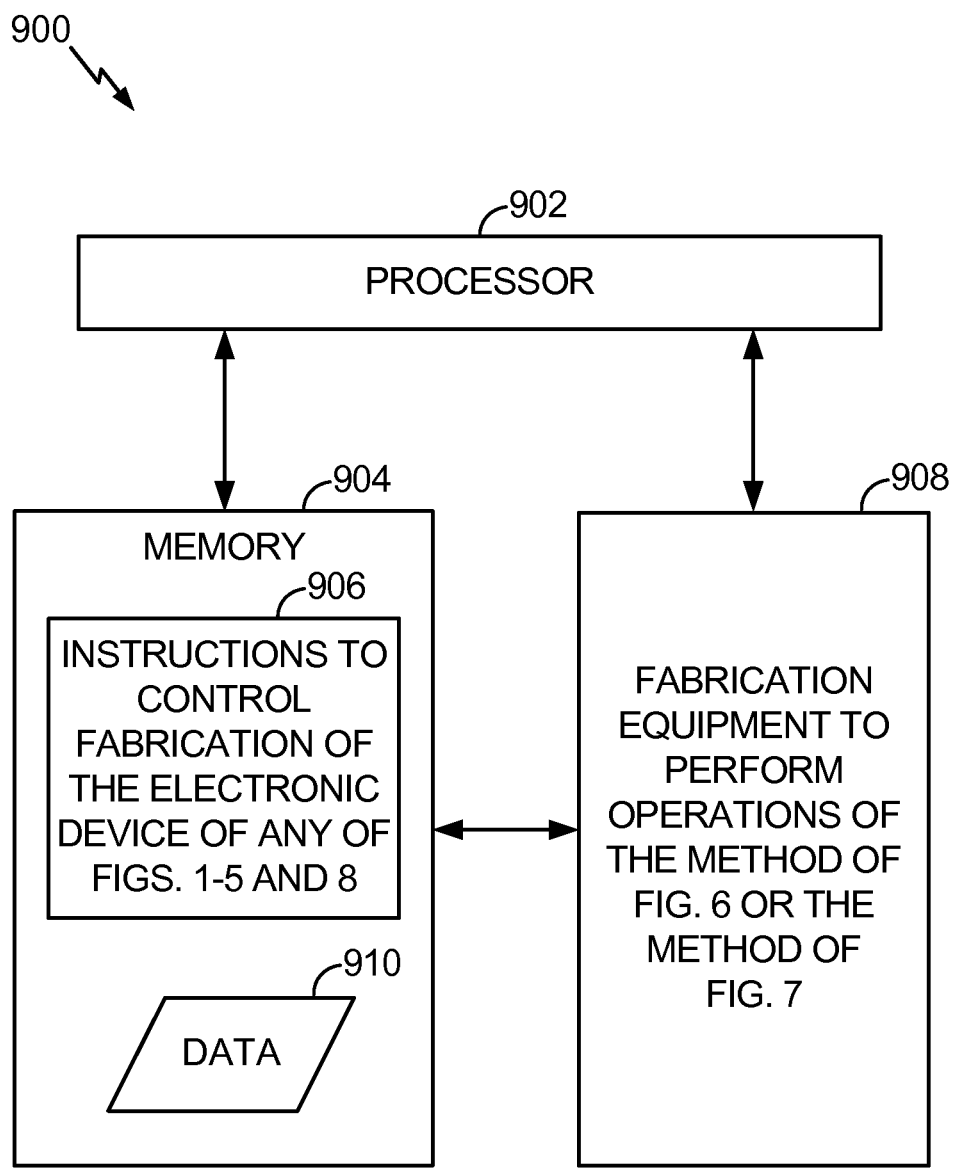
FIG. 9 is a block diagram of an illustrative aspect of a fabrication system to use data to fabricate a device that includes stacked devices.

Referring to FIG. 9, a fabrication system 900 may include a processor 902 coupled to a computer-readable medium, such as a memory 904. The memory 904 stores instructions 906 executable by the processor 902 to fabricate an interposer (e.g., the stack region 102), to fabricate an electronic device, such as any of the electronic devices 100, 200, 300, 400, and 500, or a combination thereof. For example, the instructions 906 may be executable by the processor 902 to initiate or control one or more operations of the method 600. As an illustrative example, the instructions 906 may be executable by the processor 902 to initiate or control operations performed by fabrication equipment 908 to fabricate any of the electronic devices 100, 200, 300, 400, and 500. The instructions 906 may be executable by the processor 902 to control or initiate one or more processes at the fabrication equipment 908, such as one or more substrate-based processes (e.g., one or more of a doping process, an implanting process, a growth process, a diffusion process, or an epitaxial growth process), one or more deposition processes (e.g., one or more of a thin film deposition process or a metal deposition process), one or more patterning processes (e.g., one or more of an etch process, a drilling process, or a laser scribe process), or a combination thereof, as illustrative examples.

The memory 904 may store data 910. The data 910 may indicate one or more devices described herein. For example, the data 910 may be usable by the fabrication equipment 908 to fabricate one or more devices described herein. The data 910 may represent a physical design of the one or more devices. The fabrication equipment 908 may be configured to access the data 910 and to use the data 910 during fabrication of one or more devices. For example, the data 910 may specify physical properties associated with one or more devices, and the fabrication equipment 908 may be configured to fabricate the one or more devices based on the data 910.

In connection with the described aspects, a non-transitory computer-readable medium (e.g., the memory 904) stores data (e.g., the data 910) that that is usable by fabrication equipment (e.g., the fabrication equipment 908) to fabricate a device (e.g., by performing one or more operations of the method 600, one or more operations of the method 700, or a combination thereof). The device may include a first device disposed within a substrate (e.g., the substrate 104) or within an interposer (e.g., the stack region 102). For example, the device 108 is included in the substrate 104. In this example, the first device may include a device formed within the substrate 104, such as a diode (e.g., as described with reference to FIG. 2) or a trench capacitor (e.g., as described with reference to FIG. 5). As another example, the device 112 is included in the interposer. In this example, the first device may include a thin film diode formed within the interposer (e.g., as described with reference to FIG. 3) or a thin film capacitor formed within the interposer (e.g., as described with reference to FIG. 4).

The device may further include a second device within the interposer. For example, the first device may correspond to the device 112, and the second device may correspond to the device 116. As another example, the first device may correspond to the device 108, and the second device may correspond to the device 112. The first device and the second device have a stacked configuration. The second device may include a thin film diode or a thin film capacitor, such as a planar decoupling capacitor (decap), as illustrative examples. In an illustrative implementation, the first device includes a semiconductor device (e.g., a diode) formed using a doping process, and the second device includes a thin film device formed using a thin film deposition process. In another implementation, the first device and the second device each include a thin film device formed within an interposer (e.g., the stack region 102) using a thin film deposition process. The data may represent a physical design of the device.

In connection with the described aspects, an apparatus (e.g., the electronic device 100) includes a substrate (e.g., the substrate 104) and an interposer (e.g., the stack region 102) that is associated with the substrate. The apparatus may further include a first device disposed within the substrate or within the interposer. For example, the first device may correspond to the device 108 or the device 112. The device 108 is disposed within the substrate 104, and the device 112 is disposed within the stack region 102. The apparatus may further include a second device disposed within the interposer. For example, the devices 112, 116 are formed within the stack region 102. The first device and the second device may be arranged in a stacked configuration. For example, the devices 108, 112 are arranged in a stacked configuration. As another example, the devices 112, 116 are arranged in a stacked configuration. As an additional example, the devices 108, 116 are arranged in a stacked configuration.

In connection with the described aspects, an apparatus includes first means for performing circuit operations (e.g., operations of a capacitor, such as storing charge, or operations of a diode, such as determining direction of an electrical current and providing a diode resistance, as illustrative examples). The first means for performing circuit operations is disposed within a substrate or within an interposer. The apparatus further includes second means for performing circuit operations. The second means for performing circuit operations is disposed within the interposer, and the first means for performing circuit operations and the second means for performing circuit operations have a stacked configuration. For example, the substrate may correspond to the substrate 104, and the interposer may correspond to the stack region 102. The first means may correspond to the device 108 or the device 112. For example, the first means may correspond to the device 108, and the second means may correspond to the device 112. As another example, the first means may correspond to the device 112, and the second means may correspond to the device 116.

The interposer may couple a first die to a second die. The first die may include the substrate. For example, the first die may correspond to the first die 822, and the second die may correspond to the second die 823. In a particular aspects, the first die, the means for connecting, and the second die are integrated within a system-in-package (SiP) device, such as the SiP device 890. The apparatus may further include means for communicatively coupling the first die and the second die. The means for communicatively coupling may include a via (e.g., the via 124) that communicatively couples the first die and the second die. For example, the via may be configured to enable communication between the first die and the second die.

The foregoing disclosed devices and functionalities may be designed and represented using one or more computer files (e.g., RTL, GDSII, GERBER, etc.), which may include the data 910 (or a representation of the data 910). The one or more computer files may be stored on computer-readable media, such as the memory 904. Some or all such files may be provided to fabrication handlers who fabricate devices based on such files, such as using the fabrication equipment 908. Resulting products include wafers that are then cut into die and packaged into integrated circuits (or "chips"), such as any of the first die 822 and the second die 823. The chips are then employed in electronic devices, such as within the electronic device 800.

Further, one or more functions or components described with reference to of any of FIGS. 1-9 may be combined with one or more other functions or components of FIGS. 1-9. Accordingly, no single example described herein should be construed as limiting. Instead, examples of the disclosure may be suitably combined without departing from the teachings of the disclosure.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

A storage medium (e.g., any of the memories 832, 904) may include a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transitory storage medium known in the art. An exemplary storage medium may be coupled to a processor (e.g., any of the processors 810, 902) such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. An apparatus comprising:
   a substrate;
   an interposer coupled to the substrate and configured to couple a first integrated circuit die to a second integrated circuit die, wherein the first integrated circuit die includes the substrate;
   a first diode disposed within the interposer; and
   a second diode disposed within the interposer, wherein an entirety of the second diode is disposed within the interposer, and wherein the first diode and the second diode are arranged in a stacked configuration along a direction normal to the substrate, the second diode is positioned between the first diode and the substrate along the direction normal to the substrate.

2. The apparatus of claim 1, wherein the first diode comprises a thin film diode.

3. The apparatus of claim 1, wherein the first diode comprises a Schottky diode, and wherein an entirety of the second diode is included in the interposer.

4. The apparatus of claim 3, wherein the first diode comprises a first thin film diode, and wherein the second diode comprises a second thin film diode.

5. The apparatus of claim 4, wherein the first thin film diode and the second thin film diode are configured to provide electrostatic discharge (ESD) protection.

6. The apparatus of claim 1, wherein the substrate comprises a silicon substrate.

7. The apparatus of claim 1, wherein the substrate comprises a glass substrate, and wherein the interposer is in contact with the substrate.

8. The apparatus of claim 1, wherein the first diode and the second diode are coupled in parallel.

9. The apparatus of claim 1, wherein the first diode has a first polarity, the second diode has a second polarity, and the first polarity and the second polarity are opposite polarities.

10. The apparatus of claim 1, wherein a portion of the interposer is positioned between the second diode and the substrate.

11. The apparatus of claim 1, further comprising:
    a first doped region of the first diode;
    a first conductive region coupled to the first doped region;
    a second doped region of the first diode; and
    a second conductive region coupled to the second doped region.

12. The apparatus of claim 11, further comprising:
    a third doped region of the second diode;
    a third conductive region coupled to the third doped region;
    a fourth doped region of the second diode; and
    a fourth conductive region coupled to the fourth doped region.

13. The apparatus of claim 12, further comprising:
    a first via structure coupled to the first conductive region;
    a second via structure coupled to the second conductive region;
    a third via structure coupled to the third conductive region;
    a fourth via structure coupled to the fourth conductive region; and
    a first portion of a metal layer and a second portion of the metal layer, the first portion coupled to the first via structure and the third via structure, the second portion coupled to the second via structure and the fourth via structure.

14. The apparatus of claim 1, wherein the first integrated circuit die including the substrate, the second integrated circuit die, and the interposer have a stacked configuration in which the interposer is positioned between the first integrated circuit die including the substrate and the second integrated circuit die.

15. A method of fabrication of an electronic device, the method comprising:
    forming a first diode, the first diode disposed within an interposer of the electronic device, the interposer configured to couple a first integrated circuit die to a second integrated circuit die, wherein the first integrated circuit die includes a substrate; and forming a second diode within the interposer, wherein an entirety of the second diode is disposed within the interposer, and wherein the first diode and the second diode are arranged in a stacked configuration along a direction normal to the substrate, the second diode is positioned between the first diode and the substrate along the direction normal to the substrate.

16. The method of claim 15, wherein the first diode comprises a third thin film diode, and wherein forming the first diode comprises:
forming a first doped region of the first diode;
forming a first conductive region coupled to the first doped region;
forming a second doped region of the first diode; and
forming a second conductive region coupled to the second doped region.

17. The method of claim 16, wherein the second diode comprises a second thin film diode, and wherein forming the second diode comprises:
forming a third doped region of the second diode;
forming a third conductive region coupled to the third doped region;
forming a fourth doped region of the second diode; and
forming a fourth conductive region coupled to the fourth doped region.

18. The method of claim 17, further comprising:
forming a first via structure coupled to the first conductive region;
forming a second via structure coupled to the second conductive region;
forming a third via structure coupled to the third conductive region;
forming a fourth via structure coupled to the fourth conductive region; and
forming a first portion of a metal layer and a second portion of the metal layer, the first portion coupled to the first via structure and the third via structure, the second portion coupled to the second via structure and the fourth via structure.

19. The method of claim 17, wherein the first doped region comprises a p-type doped region, the second doped region comprises an n-type doped region, the third doped region comprises a p-type doped region, and the fourth doped region comprises an n-type doped region.

20. An apparatus comprising:
an interposer configured to couple a first integrated circuit die to a second integrated circuit die, wherein the first integrated circuit die includes a substrate; first means for performing circuit operations, the first means for performing circuit operations disposed within an interposer and comprises a first diode; and
second means for performing circuit operations, the second means for performing circuit operations disposed within the interposer and comprises a second diode, wherein an entirety of the second diode is disposed within the interposer, and wherein the first means for performing circuit operations and the second means for performing circuit operations have a stacked configuration along a direction normal to the substrate, the second means for performing circuit operations is positioned between the first means for performing circuit operations and the substrate along the direction normal to the substrate.

21. The apparatus of claim 20, further comprising:
the first integrated circuit die; and
the second integrated circuit die, wherein the first integrated circuit die, the interposer, and the second integrated circuit die are integrated within a system-in-package (SiP) device.

22. The apparatus of claim 21, further comprising means for communicatively coupling the first integrated circuit die and the second integrated circuit die, the means for communicatively coupling included in the interposer.

23. The apparatus of claim 22, wherein the means for communicatively coupling includes a via that communicatively couples the first integrated circuit die and the second integrated circuit die.

24. A non-transitory computer-readable device storing instructions that, when executed by a processor, cause the processor to:
initiate fabrication, by fabrication equipment, of a first diode disposed within an interposer coupled to a substrate, the interposer configured to couple a first integrated circuit die to a second integrated circuit die, wherein the first integrated circuit die includes the substrate; and
initiate fabrication, by the fabrication equipment, of a second diode within the interposer, wherein an entirety of the second diode is disposed within the interposer, and wherein the first diode and the second diode are arranged in a stacked configuration along a direction normal to the substrate, the second diode is positioned between the first diode and the substrate along the direction normal to the substrate.

25. The non-transitory computer-readable device of claim 24, wherein the first diode and the second diode are coupled in parallel.

26. The non-transitory computer-readable device of claim 24, wherein the first diode has a first polarity, the second diode has a second polarity, and the first polarity is opposite the second polarity.

27. The non-transitory computer-readable device of claim 24, wherein the interposer and the substrate are included in an electronic device that includes a pad, the first diode enabling discharge of first current from the pad to the substrate, and the second diode enabling discharge of second current from the substrate to the pad.

* * * * *